(12) United States Patent
Lang et al.

(10) Patent No.: US 7,886,205 B2
(45) Date of Patent: Feb. 8, 2011

(54) VERIFICATION OF A DATA PROCESSING SYSTEM USING OVERLAPPING ADDRESS RANGES

(75) Inventors: Michelle J. Lang, St. Paul, MN (US); Joseph B. Lang, legal representative, Iowa City, IA (US); William Judge Yohn, River Falls, WI (US)

(73) Assignee: Unisys Corporation, Blue Bell, PA (US)

( * ) Notice: Subject to any disclaimer, the term of this patent is extended or adjusted under 35 U.S.C. 154(b) by 406 days.

(21) Appl. No.: 12/214,923

(22) Filed: Jun. 24, 2008

(65) Prior Publication Data

US 2009/0319837 A1    Dec. 24, 2009

(51) Int. Cl.
*G11C 29/00*   (2006.01)
*G11C 8/00*    (2006.01)
*G06F 11/00*   (2006.01)
*G06F 13/00*   (2006.01)
*G06F 9/26*    (2006.01)

(52) U.S. Cl. .......................... 714/718; 714/702; 714/42; 714/53; 714/54; 714/57; 711/150; 711/151; 711/157; 711/200; 711/217; 365/230.01

(58) Field of Classification Search ................ 714/718, 714/702, 42, 53, 54, 57; 711/150, 151, 157, 711/200, 217; 365/230.01

See application file for complete search history.

(56) References Cited

U.S. PATENT DOCUMENTS

| | | | | |
|---|---|---|---|---|
| 5,530,837 A | * | 6/1996 | Williams et al. | 711/157 |
| 5,634,007 A | * | 5/1997 | Calta et al. | 711/164 |
| 5,737,570 A | * | 4/1998 | Koch | 711/149 |
| 6,516,393 B1 | * | 2/2003 | Fee et al. | 711/150 |
| 6,718,419 B1 | * | 4/2004 | Delvaux | 710/305 |
| 6,993,640 B2 | * | 1/2006 | Doing et al. | 712/200 |

* cited by examiner

*Primary Examiner*—John J Tabone, Jr.
(74) *Attorney, Agent, or Firm*—Robert P. Marley; Charles A. Johnson

(57) ABSTRACT

Verifying operation of a data processing system. A first sequence of addressing ranges is generated for multiple requesters. Each addressing range includes a start and an end address and a respective identifying number. A second sequence of verification ranges is generated corresponding the addressing ranges of the first sequence. Each verification range includes a start and an end address and specifies at least one allowed value including each respective identifying number of all of the addressing ranges that overlap the verification range. A respective accessing activity executing on each requestor accesses each addressing range in the first sequence. The accesses include writing the respective identifying number of the addressing range to at least one address of the addressing range. A verification activity executing on a requestor reads a value from each address of each verification range of the second sequence and outputs an error message in response to the value not matching the allowed value.

20 Claims, 3 Drawing Sheets

VERIFICATION OF A DATA PROCESSING SYSTEM USING OVERLAPPING ADDRESS RANGES

FIELD OF THE INVENTION

The present invention generally relates to verification of data processing systems.

BACKGROUND

In modern large-scale computer systems containing multiple requestors and multiple hierarchical levels of system memory, the multiple requestors can make concurrent memory accesses to address ranges that are separate or overlapped. These accesses can include multiple concurrent accesses to the same architectural structure, such as a cache line or a page frame. Consequently, a system with multiple hierarchical levels of system memory presents many challenges for maintaining and verifying data integrity.

When multiple requesters initiate simultaneous or nearly simultaneous memory requests to a specific address range, it is difficult to determine the order in which the requests will arrive at the memory. Requestor #1 may obtain access before requestor #2 or vice versa. If Requesters #1 and #2 are both modifying the same address, it is difficult to determine the order of the modifications. Thus, the data at any instant in time might originate from any requestor. A system could have more than 32 requestors. With this number of requesters, it is extremely difficult to identify what data should exist in memory at any instant in time.

For a system containing intermediate levels of memory such as cache units, data can be resident in one or more of the cache units. A cache unit might have to write modified data to main memory and invalidate the data in the cache unit before allowing another requestor to access the data. Modified data in a cache unit must be identified so any subsequent requestors will request a current copy of the modified data. A cache unit might also write modified data to main memory to make room for storing some other data. Thus, it is extremely difficult to identify the proper location for data within the memory hierarchy at any instant in time.

In addition to being extremely difficult to identify what data should exist where in the memory hierarchy at any instant in time, it is extremely difficult to determine when to verify the data in a dynamic system environment. If data is verified after all requestor accesses have been completed, only the final data can be verified. It is possible that one or more forms of data corruption could have existed during the accesses, but a later access overwrites the corrupted data. Thus, data verification during the accesses is required, but such intermediate data verification is difficult to accomplish.

If data corruption is detected by a particular sequence of access requests, the sequence of access request often needs to be reproduced to isolate the cause of the data corruption. It is extremely difficult isolate a system defect causing data corruption because it is virtually impossible to reproduce the particular sequence of access requests that detects the data corruption.

A method and system that address these and other related issues are therefore desirable.

SUMMARY

The various embodiments of the invention provide methods and systems for verifying operation of a data processing system including a plurality of requesters. In one embodiment a method comprises generating a first sequence of addressing ranges for the requesters. Each addressing range within the first sequence includes a start and an end address of the addressing range and a respective identifying number of the addressing range. A second sequence of verification ranges is generated corresponding the addressing ranges of the first sequence. Each verification range in the second sequence includes a start and an end address of the verification range and specifies at least one allowed value including each respective identifying number of all of the addressing ranges that overlap the verification range. A respective accessing activity is executed on each requestor causing the requester to access to each addressing range in the first sequence. The accesses include writing the respective identifying number of the addressing range to at least one address of the addressing range. A verification activity is executed on at least one of the requesters, causing that requestor to read a value from each address of each verification range of the second sequence and output an error message in response to the value not matching the at least one allowed value of the verification range.

In another embodiment, a data processing system comprises means for generating a first sequence of addressing ranges Each addressing range within the first sequence includes a respective identifying number of the addressing range. Another means is provided for generating a second sequence of verification ranges corresponding the addressing ranges of the first sequence. Each verification range in the second sequence specifies at least one allowed value including each respective identifying number of all of the addressing ranges that overlap the verification range. The system further includes means for performing accesses to each addressing range in the first sequence. The accesses include writing the respective identifying number of the addressing range to at least one address of the addressing range. Means are provided for reading a value from each address of each verification range of the second sequence, and means are provided for outputting an error message in response to the value not matching the at least one allowed value of the verification range.

A data processing system is provided in another embodiment. The data processing system includes a processor arrangement coupled to a memory. The memory is configured with instructions that are executable by the processor arrangement for verifying operation of the data processing system. In executing the instructions the processor arrangement generates a first sequence of addressing ranges. Each addressing range within the first sequence includes a respective identifying number of the addressing range. The processor arrangement further generates a second sequence of verification ranges corresponding the addressing ranges of the first sequence. Each verification range in the second sequence specifies at least one allowed value including each respective identifying number of all of the addressing ranges that overlap the verification range. The processor arrangement performs accesses to each addressing range in the first sequence. The accesses including writing the respective identifying number of the addressing range to at least one address of the addressing range. A value is read by the processor arrangement from each address of each verification range of the second sequence. In response to the value not matching the at least one allowed value of the verification range, the processor arrangement outputs an error code.

The above summary of the present invention is not intended to describe each disclosed embodiment of the present invention. The figures and detailed description that follow provide additional example embodiments and aspects of the present invention.

BRIEF DESCRIPTION OF THE DRAWINGS

Other aspects and advantages of the invention will become apparent upon review of the Detailed Description and upon reference to the drawings in which.

DETAILED DESCRIPTION

Figure 1:
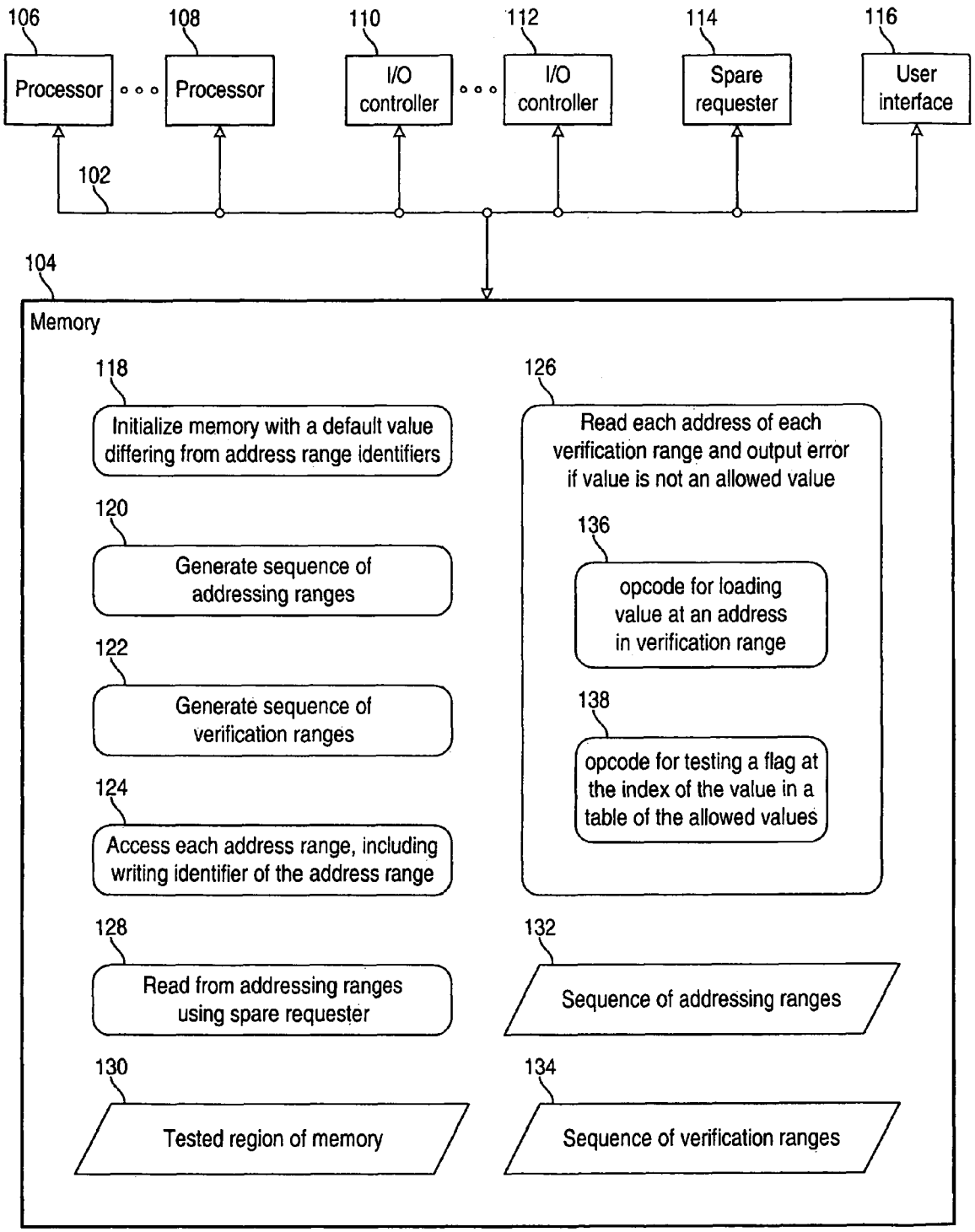
FIG. 1 is a block diagram of a data processing system in accordance with one or more embodiments of the invention.

FIG. 1 is a block diagram of a data processing system in accordance with one or more embodiments of the invention. A system bus or a hierarchy of system buses on line 102 interconnects memory 104 with processors 106 through 108, input/output controllers 110 through 112, spare requester 114, and user interface 116. Processors 106 through 108, input/output controllers 110 through 112, and spare requester 114 are requesters that initiate memory access requests to memory 104.

Memory 104 is configured with software modules 118 through 128 for verifying operation of the data processing system. The instructions of software modules 118 through 126 are executable by one or more of processors 106 through 108. In one embodiment, the instructions of software module 128 are executable by spare requester 114, which is another processor. In another embodiment, the instructions of software module 128 are also executable by one or more of processors 106 through 108 and. The processors direct the input/output controllers 110 through 112 to either read the data from memory and write that data to mass storage (not shown) or the inverse in which case data is read from mass storage and written into memory.

The instructions of software module 118 initialize memory 104 to a default value. In one embodiment, software module 118 initializes tested region 130 of memory 104 to the default value. The instructions of software module 120 generate a sequence 132 of addressing ranges within memory 104. The instructions of software module 122 generate a sequence 134 of verification ranges within memory 104.

During testing of memory 104 in one embodiment, the execution of the instructions of software module 124 causes processors 106 through 108 and input/output controllers 110 through 112 to access the tested region 130 within the address ranges defined by sequence 132 of addressing ranges.

Each requester, including processors 106 through 108 and input/output controllers 110 through 112, has a corresponding identifier that differs from the default initialization value of software module 118. Certain of the accesses to the tested region 130 are write accesses. In one embodiment, execution of the instructions of software module 124 causes each requestor to perform a series of write accesses within the address ranges defined by sequence 132, and each write access from each requester includes the identifier of the requestor. Thus, software module 124 causes the requesters to write data that identifies the requester.

In one embodiment, each address range in sequence 132 has a corresponding identifying number and each address range in sequence 132 is assigned to a specific requester. Each write to an address range from the assigned requestor has write data that includes the identifying number of the request range. Because the identifying number identifies the address range and each address range is assigned to a specific requester, the identifying number identifies both the address range and the requestor assigned to the address range.

The execution of the instructions of software module 126 causes one or more of processors 106 through 108 and input/output controllers 110 through 112 to read and verify each address from each address range. Upon detecting an incorrect value, software module 126 causes an error message to be output on user interface 116. In one embodiment, the error message includes the identifying number extracted from the incorrect value and the identifying number identifies the requestor originating the incorrect value.

The sequence 134 of verification ranges reformats the sequence 132 of addressing ranges to permit efficient verification of each address in the addressing ranges. In one embodiment, software module 126 include an instruction 136 for loading the value stored at an address in a verification range and another instruction 138 for verifying the value loaded by instruction 136. A software loop repeatedly executes instructions 136 and 138 to verify each address in each verification range.

In one embodiment, the execution of the instructions of software module 128 by, for example, spare requester 114 provides interference while the processors 106 through 108 and input/output controllers 110 through 112 are testing the memory 104 by executing software modules 124 and 126. The interference causes data to move back and forth between the cache units of the spare requester 114 and the other requestors. This interference can increase the intensity of the testing.

Figure 2:
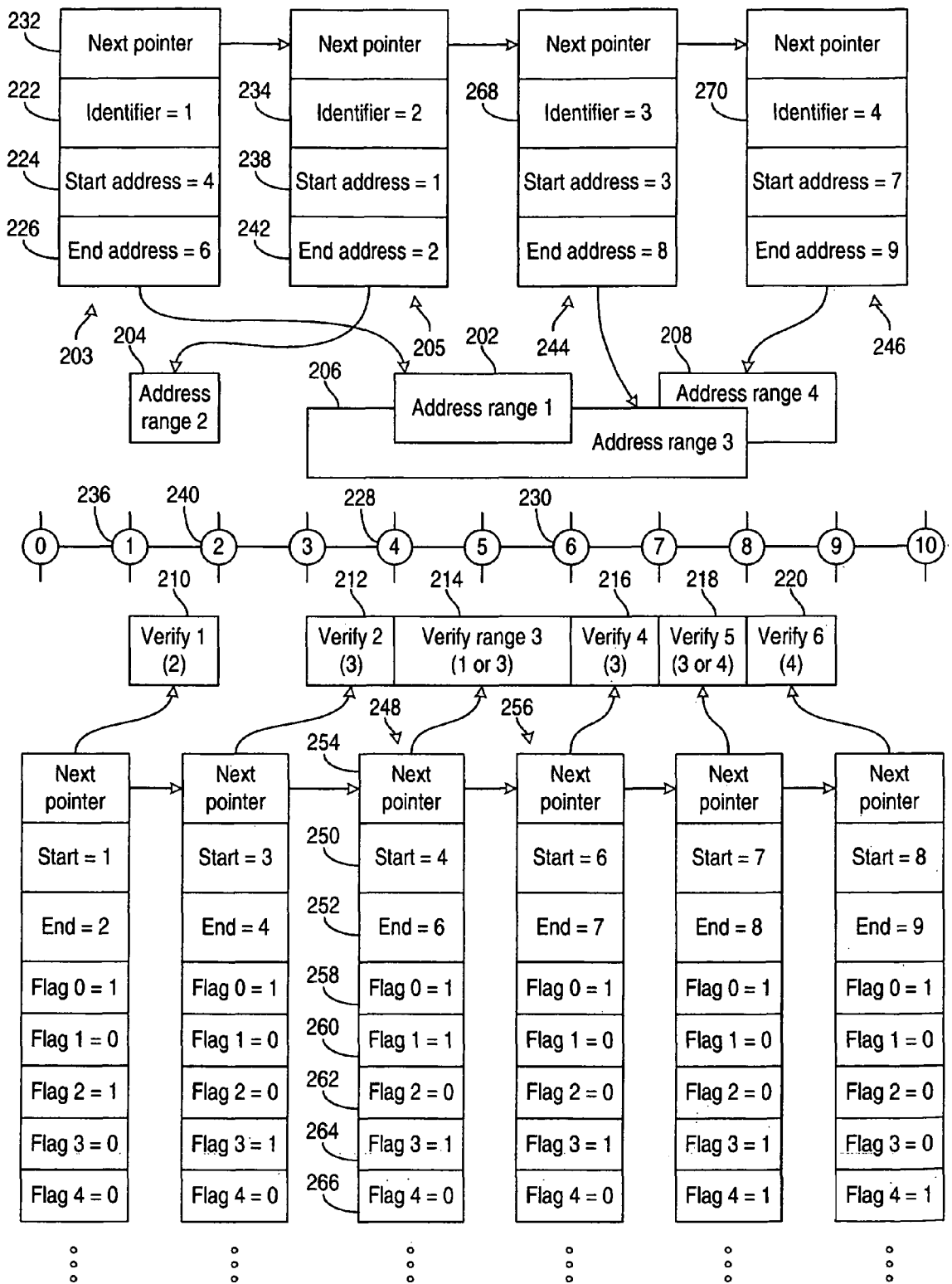
FIG. 2 is a diagram of data structures for verifying a data processing system in accordance with various embodiments of the invention.

FIG. 2 is a diagram of example data structures for verifying a data processing system in accordance with various embodiments of the invention. Test software generates address ranges 202, 204, 206, and 208 in a sequence. In one embodiment, the address ranges 202, 204, 206, and 208 are included in the sequence in the order of generation of the address ranges. The test software reformats the address ranges 202, 204, 206, and 208 into verification ranges 210 through 220 to permit efficient verification of data written to the address ranges.

The test software first generates address range 202 in this example. A descriptor 203 of address range 202 includes an identifier 222 of address range 202, and a starting address 224 and an ending address 226 of the addressing range. The value of the starting address 224 indicates that address range 202 starts at address four 228 in the memory, and the value of the ending address 226 indicates that address range 202 ends at or immediately before address six 230 in the memory. The descriptor 203 of address range 202 also includes a pointer 232 to any descriptor 205 of the next address range 204 in the sequence.

The test software next generates the address range 204 with identifier 234. The test software determines whether to overlap the address range 204 with the existing address range 202 in the sequence. In one embodiment, the test software randomly selects whether to overlap the address range 204 with the existing address range 202 or ranges. In this example, the test software selects no overlap and creates a descriptor 205 of the address range 204 that includes a value of address one 236 for the starting address 238 and a value of address two 240 for the ending address 242.

In this example, the test software selects overlap for the next address range 206 and then selects complete overlap of the existing address range 202 in the sequence. The test software appropriately initializes the descriptor 244 of the address range 206. Similarly, the test software appropriate initializes the descriptor 246 of the next address range 208 after selection partial overlap with existing address range 206. In one embodiment, the address ranges are included in the sequence of descriptors in the order of generation of the address ranges.

After completing the generation of the sequence of address ranges 202, 204, 206, and 208, the test software reformats the address ranges 202, 204, 206, and 208 into the verification ranges 210 through 220. In one embodiment, the verification ranges 210 through 220 are included in a sequence in the order of increasing addresses.

A verification range is a range of addresses in the memory that are accessed using a specific combination of one or more of addressing ranges 202, 204, 206, and 208. The verification ranges 210 through 220 delineate the overlap boundaries of the address ranges 202, 204, 206, and 208.

Address range 204 has a corresponding verification range 210, because address range 204 does not overlap any of the other address ranges 202, 206, and 208. Because address range 206 has four separate regions of overlap with address ranges 202 and 208, address range 206 has four corresponding verification ranges 212, 214, 216, and 218. Verification range 212 corresponds to a portion of address range 206 that is only included in address range 206. Similarly, verification range 216 corresponds to a separate portion of address range 206 that is only included in address range 206. Verification range 214 corresponds to the overlap between address ranges 206 and 202; and verification range 218 corresponds to the overlap between address ranges 206 and 208. Finally, verification range 220 corresponds to the portion of address range 208 that is only included in address range 208.

Each of verification ranges 210 through 220 has a corresponding descriptor. For example, verification range 214 has a descriptor 248 that has a value of address four 228 for a starting address 250 and a value address six 230 for an ending address 252. Descriptor 248 also includes a pointer 254 to the descriptor 256 of a next verification range 216 in increasing address order.

In one embodiment, each descriptor includes a linear array of flags. For example, descriptor 248 includes a linear array of flags 258, 260, 262, 264, and 266. Flags 258 through 266 indicate the expected values of memory within verification range 214. Verification range 214 is initialized to a default value and an accessing activity accesses verification range 214 using only address ranges 202 or 206. Every write access of the accessing activity using address range 202 writes the value of identifier 222 and every write of the accessing activity using address range 206 writes the value of identifier 268. Thus, at various times the expected values of memory within verification range 214 are the default value and the values of identifiers 222 and 268. To indicate the expected values, flag 258 for the default value and respective flags 260 and 264 for the values of identifiers 222 and 268 are set to a "true" value of one. The other flags 262 and 266 are set to a "false" value of zero.

After generating the address ranges 202 through 208 and the verification ranges 210 through 220, the test software begins an accessing activity. In one embodiment, the accessing activity assigns address ranges 202 through 208 to the requestors. For example, the accessing activity initially assigns an address range to each requester and the requestor performs accesses to the address range. After each requestor completes accessing its assigned address range, the accessing activity assigns another address range to the requestor until all address ranges 202 through 208 are assigned.

In one embodiment, the requestor to first complete accessing its assigned address is the requestor that executes the verification activity. An advantage of certain embodiments of the invention is that the verification activity can begin while most or all of the requesters are continuing to access their assigned address ranges.

In one embodiment, the verification activity has an outer loop for sequentially verifying each of the verification ranges 210 through 220. The verification activity has an inner loop for sequentially reading each address between, for example, the starting address 250 and the ending address 252 of the verification range 214. Within the inner loop, the verification activity reads an address and uses the value read from the address to index into a linear array of flags for verifying whether the value is an expected value. For example, the value read from an address in verification range 214 indexes into the linear array of flags 258 through 266 for verifying whether the value is a default value or the value of identifier 222 or 268.

If the accessing activity has not yet written the address in verification range 214, then the address should have the default value, which is zero in this example, selecting flag 258 that indicates the default value is valid. If the accessing activity has most recently used addressing range 202 to write to the address, then the address should have the value of identifier 222 selecting flag 260 that indicates the value is valid. If the accessing activity has most recently used addressing range 206 to write to the address, then the address should have the value of identifier 268 selecting flag 264 that indicates the value is valid. Otherwise, the value selects one of the other flags 262 or 266 that indicate the value is invalid. It will be appreciated that the order of the accesses can be unpredictable for concurrently executed accessing and verification activities. However, the verification activity can still verify that each tested address has one of the expected values.

Verification ranges 210 through 220 provide efficient verification because each address in each verification range can be verified using two instructions for certain types of requesters. A first instruction loads a tested value from a memory location selected by a pointer register while incrementing the pointer register to select the next memory location. A second instruction loads and checks a flag selected by adding the tested value to a base register pointing to the beginning of a linear array of flag values. If the flag check indicates the tested value is invalid, the second instruction branches to a routine for outputting an error message on a user interface.

In one embodiment, each requestor loads and stores bytes or larger data words. During initialization, each byte in the address ranges 202 through 208 is initialized to a zero-byte. During the accessing activity, each write access to one of address ranges 202 through 208 writes a byte value of the corresponding identifier 222, 234, 268, or 270 of the address range. Because there are 255 possible non-zero values of a byte there are at most 255 address ranges. It will be appreciated that the corresponding size of the linear array of flag values is 256 flag entries.

In one embodiment, data verification is accomplished using the techniques of U.S. Pat. No. 7,200,721 entitled, "Verification of Memory Operations by Multiple Processors to a Shared Memory" by Lang et. al. and issued Apr. 3, 2007, which is incorporated by reference herein in its entirety. For example, during the accessing activity each requestor writes values within a reference count range to every location in each address range. The verification activity detects stale data when the value read from a verification range does not fail within the expected reference count range.

Figure 3:
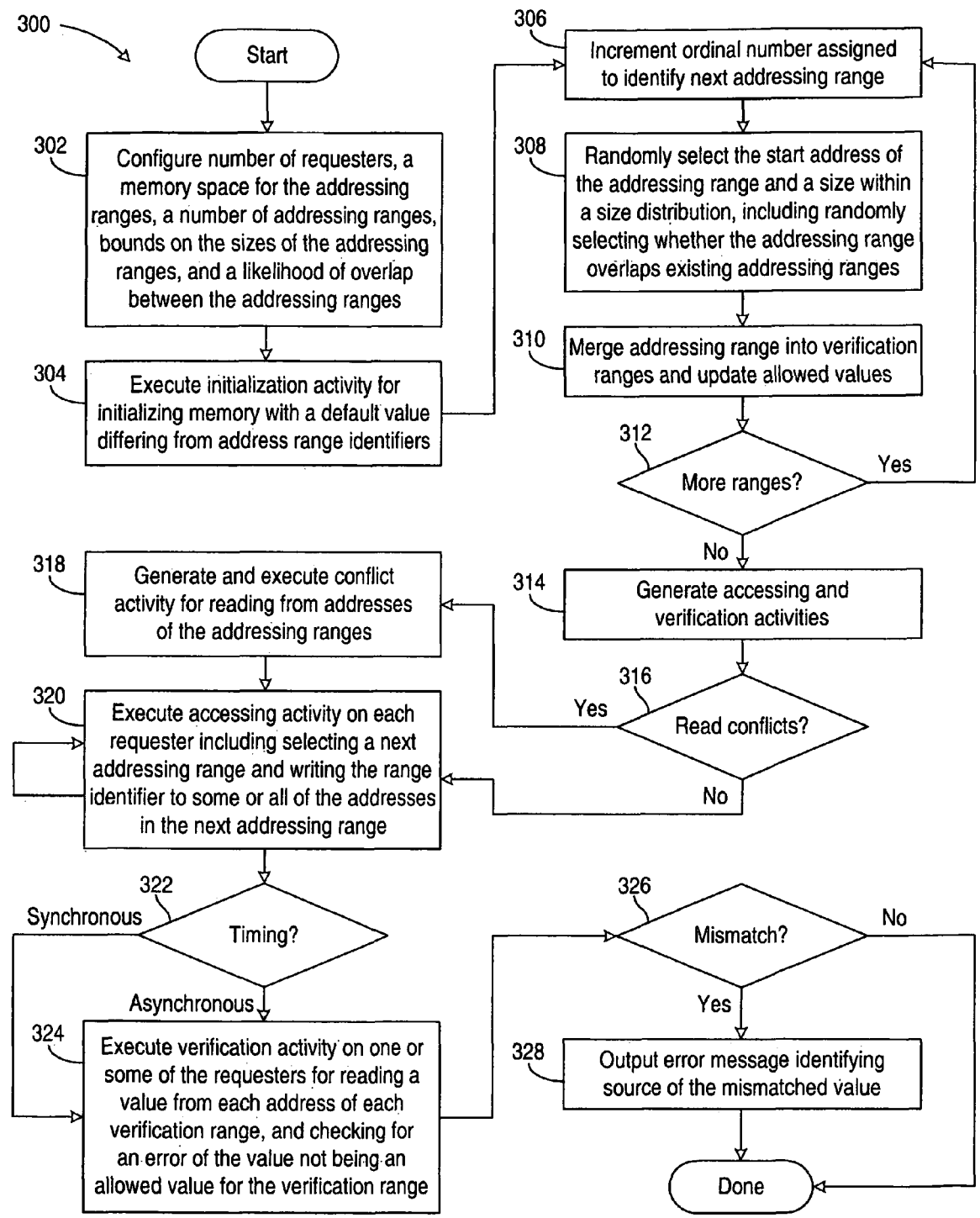
FIG. 3 is a flow diagram of a process for verifying a data processing system in accordance with various embodiments of the invention.

FIG. 3 is a flow diagram of a process 300 for verifying a data processing system in accordance with various embodiments of the invention. A test program generates accesses using address ranges and verifies the accesses using verification ranges.

At step 302, a user configures the test program or a default configuration is used. The requestors are selected from the processors and input/output controllers of the data processing system. The remaining processors and input/output controllers are spare requesters. The spare requestors can be configured to generate read conflicts. A portion of the memory space is designated for testing. For example, one portion of a physical memory space is reserved for the software instructions and the data structures of a test program, and the test program allocates the remaining physical memory space for testing by the test program. A number of address ranges and bounds on the sizes of the address ranges are selected. A likelihood for selecting overlap between the address ranges is input.

One of the advantages of the approach described herein is that the program instructions are segmented such that the active code block will reside in the first-level cache (highest speed) in the system. By segmenting the code in this manner, few requests to retrieve the next instruction to be executed in sequence will be made to memory. The instructions will instead be retrieved from first-level cache. Hence a block of instructions will be paged into the first-level cache and no further memory requests will be made to fetch instructions until every instruction in that cache line has been executed. This serves to increase the test efficiency as the actual testing is interrupted at a much lower rate by minimizing the interleaving of test accesses and instruction fetches to the other cache levels/memory under test.

At step 304, an initialization activity initializes the designated portion of the memory with a default value that differs from the identifiers of the address ranges. For example, the default value can be zero and the identifiers of the address ranges are non-zero values.

At step 306, process 300 increments an ordinal number for identifying an addressing range in a sequence. At step 308, starting and ending address are selected for the addressing range. The size of the addressing range is selected within a provided distribution or range of sizes. Process 300 randomly selects whether to overlap each addressing range with the existing addressing ranges. If overlap is selected, the starting and/or ending addresses of the addressing range are selected to partially or fully overlap one or more of the existing addressing ranges.

At step 310, the addressing range is merged into a sequence of verification ranges. If the addressing range does not overlap any existing verification ranges, then a new verification range is created with the same limits as the addressing range. In addition, if one or more portions of the addressing range do not overlap any existing verification ranges, then a new verification range is created for each such portion. If the addressing range fully overlaps any existing verification ranges, then these existing verification ranges are updated to include the identifier of the addressing range. If the addressing range partially overlaps an existing verification range, then the verification range is split into two verification ranges for the overlapped and the non-overlapped portions of the existing addressing range.

Decision 312 checks whether more address ranges need generation. To generate more address ranges, process 300 returns to step 306; otherwise, process 300 proceeds to step 314. At step 314, the accessing activities are generated based on the address ranges and the verification activity or activities are generated based on the verification ranges.

Decision 316 checks whether read conflicts should be generated. To generate read conflicts, process 300 proceeds to step 318. At step 318, process 300 generates a conflict activity for the spare requesters reading from the address ranges. Process 300 executes the conflict activity to increase the contention between the processors for the data within the address ranges.

At step 320, the accessing activity is executed on the requestors. Each requestor selects a next address range in the sequence and begins accessing memory locations with the address range. In one embodiment, after a requestor completes the accesses to an address range, the requestor selects another available address range. In another embodiment, each requestor is assigned a predetermined number of address ranges.

In one embodiment, each requestor performs a write access to every address in the address range. In another embodiment, each requestor performs a write access within every architectural structure, such as a cache line, included in the address range. In yet another embodiment, each requestor performs a mix of write and read accesses within the address ranges. Generally, every write to the address range includes the identifier of the address range. Multiple copies of the identifier can be included in a write of a data word that includes, for example, multiple bytes.

Decision 322 checks whether the verification activity is synchronous or asynchronous. Process 300 delays execution of step 324 for a synchronous verification activity that waits for the accessing activity to complete before beginning the verification activity. If the verification activity is asynchronous, the verification activity can begin as soon as a requestor becomes available after exhausting all the addressing ranges in one example. In another asynchronous example, one or more of the spare requestors perform the verification activity during the accessing activity. The verification activity reads each address in each verification range.

Decision 326 checks whether the value read from a verification range is incorrect. If the value read from a verification range does not match an expected value, process 300 proceeds to step 328. At step 328 an error message is output including the incorrect value that potentially identifies the source of the incorrect value. The error message may be a text message or a binary code depending on implementation requirements.

Those skilled in the art will appreciate that various alternative computing arrangements, including one or more processors and a memory arrangement configured with program code, would be suitable for hosting the processes and data structures of the different embodiments of the present invention. In addition, the processes may be provided via a variety of computer-readable storage media or delivery channels such as magnetic or optical disks or tapes, electronic storage devices, or as application services over a network.

The present invention is thought to be applicable to a variety of software systems. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for verifying operation of a data processing system including a plurality of requesters, comprising:

generating a first sequence of addressing ranges for the requestors, wherein each addressing range within the first sequence includes a start and an end address of the addressing range and a respective identifying number of the addressing range; generating a second sequence of verification ranges corresponding the addressing ranges of the first sequence, wherein each verification range in the second sequence includes a start and an end address of the verification range and specifies at least one allowed value including each respective identifying number of all of the addressing ranges that overlap the verification range; executing a respective accessing activity on each requestor, including the requestor performing accesses to each addressing range in the first sequence, wherein the accesses include writing the respective identifying number of the addressing range to at least one address of the addressing range; and executing a verification activity on at least one of the requesters, including the at least one requester reading a value from each address of each verification range of the second sequence and outputting an error message in response to the value not matching the at least one allowed value of the verification range.

2. The method of claim 1, wherein each requestor is one of a processor of the data processing system and an input/output controller of the data processing system.

3. The method of claim 1, further comprising configuring a number of the requesters, a total memory space for containing the addressing ranges of the first sequence, a number of addressing ranges in the first sequence, bounds on the size of each addressing range in the first sequence, and a likelihood of overlap of the addressing ranges in the first sequence.

4. The method of claim 1, wherein the generating the first sequence includes one of the requestors generating the first sequence.

5. The method of claim 1, wherein the generating the first sequence includes randomly selecting whether to produce an overlap of each addressing range with the addressing ranges already selected for the first sequence, and, in response to selecting the overlap, randomly selecting the start and end address of the addressing range to overlap at least one of the addressing ranges already selected for the first sequence.

6. The method of claim 1, wherein the generating the first sequence includes randomly selecting the start address of each addressing range and randomly selecting a size of the addressing range within a distribution of sizes, whereby the start address and the size determine the end address of the addressing range.

7. The method of claim 1, wherein each verification range in the second sequence specifies the at least one allowed value in a table having a respective flag at each index in the table, the respective flag indicating whether the at least one allowed value includes the respective identifying number corresponding to the index.

8. The method of claim 1, wherein the at least one allowed value of each verification range in the second sequence is a plurality of allowed values including a default value differing from all of the respective identifying numbers of the addressing ranges in the first sequence.

9. The method of claim 1, further comprising executing an initialization activity on at least one of the requestors, the initialization activity including the at least one requestor writing a default value to each address of each addressing range of the first sequence, the default value differing from all of the respective identifying numbers of the addressing ranges in the first sequence.

10. The method of claim 1, further comprising generating the respective accessing activity for each of the requestors responsive to the first sequence, and generating the verification activity responsive to the second sequence.

11. The method of claim 1, wherein the executing of the respective accessing activity on each requestor includes, for each addressing range for the requestor in the first sequence, the requestor writing the respective identifying number of the addressing range to every address inclusively between the start and ending addresses of the addressing range.

12. The method of claim 1, wherein the executing of the respective accessing activity on each requestor includes each requestor selecting a first respective addressing range in the first sequence and synchronously selecting a second respective addressing range in the first sequence in response to all of the requestors completing the performing of the accesses to the first respective addressing ranges.

13. The method of claim 1, wherein the executing of the respective accessing activity on each requestor includes each requestor selecting a first respective addressing range in the first sequence and asynchronously selecting a second respective addressing range in the first sequence in response to completing the performing of the accesses to the first respective addressing range.

14. The method of claim 1, wherein the executing of the verification activity includes one of the requesters synchronously checking the value from each address of each verification range of the second sequence in response to all of the requestors completing the performing of the accesses to each addressing range in the first sequence.

15. The method of claim 1, wherein the executing of the verification activity includes each of the at least one of the requestors asynchronously checking the value from each address of each verification range of the second sequence in response to the requestor completing the performing of the accesses to an addressing range for the requestor in the first sequence.

16. The method of claim 1, wherein the executing of the verification activity includes one of the requesters executing a first instruction for loading a value at an address of a verification range of the second sequence and executing a second instruction for testing a flag at an offset in a table, the offset equaling the value and the flag specifying whether the value is included in the at least one allowed value of the verification range.

17. The method of claim 1, wherein the outputting the error message includes outputting the error message that identifies one of the requestors as a source of the value that does not match the at least one allowed value of the verification range.

18. The method of claim 1, further comprising executing a conflict activity on at least one additional requestor, including each additional requestor reading from an address of an addressing range of the first sequence.

19. A data processing system, comprising:
means for generating a first sequence of addressing ranges, wherein each addressing range within the first sequence includes a respective identifying number of the addressing range;
means for generating a second sequence of verification ranges corresponding the addressing ranges of the first sequence, wherein each verification range in the second sequence specifies at least one allowed value including each respective identifying number of all of the addressing ranges that overlap the verification range;
means for performing accesses to each addressing range in the first sequence, the accesses including writing the respective identifying number of the addressing range to at least one address of the addressing range;
means for reading a value from each address of each verification range of the second sequence; and
means for outputting an error message in response to the value not matching the at least one allowed value of the verification range.

20. A data processing system, comprising:

a processor arrangement; and a memory coupled to the processor arrangement, the memory configured with instructions executable by the processing arrangement for verifying the data processing system, wherein the processor arrangement in executing the instructions, generates a first sequence of addressing ranges, wherein each addressing range within the first sequence includes a respective identifying number of the addressing range, generates a second sequence of verification ranges corresponding the addressing ranges of the first sequence, wherein each verification range in the second sequence specifies at least one allowed value including each respective identifying number of all of the addressing ranges that overlap the verification range, performs accesses to each addressing range in the first sequence, the accesses including writing the respective identifying number of the addressing range to at least one address of the addressing range, and reads a value from each address of each verification range of the second sequence and outputs an error code in response to the value not matching the at least one allowed value of the verification range.

\* \* \* \* \*